(12) United States Patent
Beck et al.

(10) Patent No.: US 7,215,369 B2
(45) Date of Patent: May 8, 2007

(54) COMPACT PIXEL RESET CIRCUITS USING REVERSED CURRENT READOUT

(75) Inventors: Jeffery S. Beck, Corvallis, OR (US); Ray A. Mentzer, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 771 days.

(21) Appl. No.: 10/406,698

(22) Filed: Apr. 2, 2003

(65) Prior Publication Data

US 2004/0196397 A1 Oct. 7, 2004

(51) Int. Cl.
*H04N 5/335* (2006.01)

(52) U.S. Cl. .................. 348/308; 348/310

(58) Field of Classification Search ............ 348/302, 348/307, 308, 310
See application file for complete search history.

(56) References Cited

U.S. PATENT DOCUMENTS

| | | | | |
|---|---|---|---|---|
| 5,488,415 A * | 1/1996 | Uno | .................... | 348/241 |
| 5,933,190 A * | 8/1999 | Dierickx et al. | ............. | 348/302 |
| 6,091,280 A * | 7/2000 | Hynecek | ............... | 327/514 |
| 6,281,533 B1 * | 8/2001 | Miyagawa et al. | .......... | 257/290 |
| 6,300,978 B1 * | 10/2001 | Matsunaga et al. | ........ | 348/308 |
| 6,424,375 B1 | 7/2002 | Fowler | | |
| 6,469,740 B1 * | 10/2002 | Kuroda et al. | .............. | 348/308 |
| 6,493,030 B1 * | 12/2002 | Kozlowski et al. | ......... | 348/310 |
| 6,858,912 B2 * | 2/2005 | Marshall et al. | ............ | 257/438 |
| 6,909,462 B1 | 6/2005 | Shinotsuka et al. | | |
| 7,067,785 B2 * | 6/2006 | Kimura | .................. | 250/208.1 |
| 2002/0024058 A1 | 2/2002 | Marshall et al. | | |
| 2004/0201761 A1 * | 10/2004 | Mentzer | .................... | 348/308 |
| 2004/0233313 A1 * | 11/2004 | Ando et al. | ................. | 348/308 |

OTHER PUBLICATIONS

Fowler, Boyd et al., "Low Noise Readout Using Active Reset for CMOS APS," presented at Space Astrophysics Detectors and Detector Technologies program on Jun. 26, 2000, 10 pages.
Combined Search and Examination Report for UK Patent Application No. 0610139.8 dated Jun. 23, 2006.

* cited by examiner

*Primary Examiner*—Ngoc-Yen Vu
(74) *Attorney, Agent, or Firm*—RatnerPrestia

(57) ABSTRACT

Compact CMOS pixel sensors containing three or four total transistors and four or five control lines provide a high percentage of sensor area for the photodiode that measures light intensity. The CMOS pixel sensors thus have good light sensitivity. The CMOS pixel sensors also provide active reset operations yielding low noise when resetting node voltages. The low transistor count is achieved using the same transistors during both reset operations and readout operation. Reversing the current direction through a pixel sensor during readout allows the row selection transistor to act as a buffer for a transistor having a gate coupled to the photodiode node.

19 Claims, 3 Drawing Sheets

COMPACT PIXEL RESET CIRCUITS USING REVERSED CURRENT READOUT

BACKGROUND

Charge-coupled device (CCD) image sensors and complementary metal-oxide semiconductor (CMOS) image sensors are the two major types of electronic image sensor currently in use. CCD image sensors can provide excellent light sensitivity and high image quality, but manufacturing of CCD image sensors generally requires specialized fabrication processes that make CCD sensors more expensive to make and more difficult to integrate with associated circuitry. CMOS image sensors, on the other hand, can be inexpensively fabricated using standard CMOS manufacturing technology and can be easily integrated on the same die with circuit blocks serving other imaging and non-imaging functions. However, high light sensitivity and high image quality are more difficult to achieve with CMOS image sensors.

FIG. 1 illustrates a conventional CMOS image sensor 100, which includes an array 110 of pixel sensors 120. Control lines (e.g., row lines 112 and column lines 114) in array 110 connect pixel sensors 120 to control circuits such as row control block 130 and column control block 140 that are outside array 110. Generally, a selection signal can be asserted on one of row line 112 to select a row of pixel sensors 110 for reading via column lines 114. FIG. 1 shows only row lines 112 and column lines 114 connected to pixel sensors 120, but more generally, the circuitry in each pixel sensor 120 also connects to additional control lines (not shown).

Capturing an image with CMOS image sensor 100 generally includes a reset operation, an integration operation, and a readout operation. The reset operation resets nodes of the photodiodes in pixel sensors 120 to a reference voltage level. After the photodiode node voltages are reset, the integration operation partially discharges (or charges) the photodiode nodes via currents that flow through the photodiodes. The current through each photodiode depends on the intensity of the incident light on the photodiode, so that the voltage on the photodiode node in a pixel sensor 120 at the end of the integration operation indicates an integral of the intensity of the incident light on that pixel sensor 120 during the integration operation. The readout operation samples or measures the voltage on photodiode nodes, and those voltages can be converted to digital pixel values.

Signal noise can be a significant problem in CMOS image sensor 100, particularly during the reset operations. Ideally, a reset operation always sets the photodiode node of a pixel sensor to the same reference voltage level. If a particular pixel sensor 120 is charged to different levels during different reset operations, the pixel values readout from the pixel sensor will be inconsistent from one image to the next, leading to poor image quality.

FIG. 2 is a circuit diagram of a conventional pixel sensor 200 that is designed to provide low noise levels during reset operations. Pixel sensor 200 includes a photodiode 210, an amplifier 220, and NMOS transistors 230, 240, 250, 260, and 270. A reset operation in pixel sensor 200 includes asserting a preset signal Vpr that turns on transistor 230 to pull down a voltage Vpd on the photodiode node of pixel sensor 200. Transistor 230 is then turned off, and a signal Vg is asserted to turn on transistor 240, which connects the output of amplifier 220 to the gate of transistor 250 and completes a feedback loop for resetting of photodiode voltage Vpd. In particular, current through transistor 250 charges the photodiode node until amplifier 220 determines that voltage Vpd, which is applied to a negative input of amplifier 220, is equal to a reference voltage Vr that is applied to a positive input of amplifier 220. Amplifier 220 then shuts off transistor 250. The reset operation thus dependably charges photodiode voltage Vpd to the level of reference voltage Vr.

Transistors 240 and 250 are off during image integration to disable the feedback loop while current through photodiode 210 changes photodiode voltage Vpd. After integration, the readout operation asserts a signal WORD on the word line 112 that is coupled to pixel sensor 200, thereby turning on transistor 270. The bit line 114 connected to pixel sensor 200 is then pulled up via a current through transistor 260, which has a gate at photodiode voltage Vpd, permitting measurement of photodiode voltage Vpd through the effect on bit line 114. U.S. Pat. No. 6,424,375, entitled "Low Noise Active Reset Readout for Image Sensors" further describes operation of pixel sensors similar to pixel sensor 200.

Pixel sensor 200 has some significant drawbacks. In particular, pixel sensor 200 has an NMOS transistor 240 in the control line for the gate of NMOS transistor 250, which pulls up photodiode voltage Vpd during the reset operation. Accordingly, the upper limit of photodiode voltage Vpd must accommodate the threshold voltage drops of two NMOS transistors, which limits the dynamic range of voltage Vpd. Pixel sensor 200 is also relatively complex requiring at least six transistors and seven independent control or voltage supply lines. The circuit area required for these transistors and lines reduces the available area for photodiodes 210. As a result, the sensor array has a lower fill factor and a corresponding loss of light sensitivity.

In view of the drawbacks of existing CMOS image sensors, pixel sensors are sought that contain fewer transistors and control lines while still implementing low-noise reset operations.

SUMMARY

In accordance with an aspect of the invention, transistors that are conventionally used for readout operation in a pixel sensor can be used both for readout operations and reset operations. This permits a reduction in the number of transistors and independent lines required per pixel sensor. The lower component count allows use of a larger portion of the image sensor area for light gathering and simplifies signal routing in an array of pixel sensors. Additionally, a reduction in the number of NMOS transistors in the feedback loop that controls the resetting of the photodiode node allows more headroom and a wider dynamic range for the photodiode voltage. A smaller number of transistors in the feedback loop also reduces the number of transistors contributing to thermal noise during the reset operation.

One embodiment of the invention is a pixel sensor including a photodiode and three transistors. The photodiode is coupled to a first node. The first transistor has a gate coupled to the first node, a first terminal coupled to a first control line, and a second terminal coupled to a second node in the pixel sensor. The second transistor has a gate coupled to the second node, a first terminal coupled to the first node, and a second terminal coupled to a second control line. The third transistor has a gate coupled to a third control line, a first terminal coupled to the second node, and a second terminal coupled to a fourth control line.

In one specific embodiment, the pixel sensor is a 3-transistor pixel sensor, and the first, second, and third transistors are the only transistors in the pixel sensor. All of the transistors in the 3-transistor sensor can be NMOS transistors.

In an alternative embodiment, the pixel sensor is a 4-transistor pixel sensor, which includes a fourth transistor having a gate coupled to a fifth control line, a drain/source coupled to the second node, and a source/drain coupled to the fourth control line. In this configuration, the first, second, and third transistors can be NMOS transistors, while the fourth transistor is a PMOS transistor.

Another specific embodiment of the invention is an image sensor including at least four sets of control lines and an array of pixel sensors of any of the above types. When each of the pixel sensors is a 4-transistor pixel sensor, a fifth set of control lines can be added. Generally, the pixel sensors in the array are arranged in rows and columns, and the first and fourth sets of control lines are column lines, and the third set of control lines are row lines.

For each column of pixel sensors, a control circuit outside the array of pixel sensors can include a current source and a switching circuit. The switching circuit is coupled to a corresponding one of the column lines from the first set and a corresponding one of the column lines in the fourth set. In one mode, which may be used for a reset operation, the switching circuit connects the current source to create a current in one direction through a selected one of the pixel sensors. In another mode, which may be used for a readout operation, the switching circuit connects the current source to create a current in an opposite direction through the selected one of the pixel sensors.

Yet another embodiment of the invention is a method for operating a pixel sensor. The method begins with driving a first current in a first direction through a first transistor and a second transistor in the pixel sensor to control resetting a voltage of a node of a photodiode in the pixel sensor. The first transistor has a gate coupled to the node, and the second transistor has a gate to which a selection signal for the pixel sensor is applied. Generally, a third has a terminal coupled to the node and a gate coupled to a terminal of the first transistor, so that the third transistor can act as a pull-up transistor for the node. After an integration operation changes the voltage on the node according to an intensity of incident light on the photodiode, the method drives a second current in the opposite direction through the first and second transistors permitting a determination of the voltage on the node from the effect of the first transistor on the second current. The first and second transistors thus sever in both resetting and reading of the node voltage.

In one variation of the method, the first transistor serves during the active reset as one of the transistors in a differential pair gain circuit. For this variation, driving the first current includes driving a third current that is split between flowing through the first transistor in the pixel sensor and a reference transistor in a control circuit. The third transistor, which has a second terminal coupled to the node and a gate coupled to a terminal of the first transistor, pulls a voltage on the node to a level corresponding to a gate voltage of the reference transistor.

In another variation of the method, an external amplifier controls the gain used during the reset operation. For this variation, driving the first current includes connecting the amplifier so that an output terminal of the amplifier is coupled to the second transistors, a first input terminal of the amplifier is coupled to a terminal of the first transistor, and a second input terminal of the amplifier is coupled to receive a reference voltage.

BRIEF DESCRIPTION OF THE DRAWINGS

Use of the same reference symbols in different figures indicates similar or identical items.

DETAILED DESCRIPTION

In accordance with an aspect of the invention, a CMOS pixel sensor achieves a low component count by using selected transistor for multiple purposes during reset, integration, and readout operations. The low component count leaves more area available for photodiodes that sense the light. Even with low component count the pixel sensor implements a feedback loop for accurate control over resetting of a photodiode voltage. The feedback loop has a low transistor count, which reduces the total thermal noise introduced by the transistors.

Figure 1:
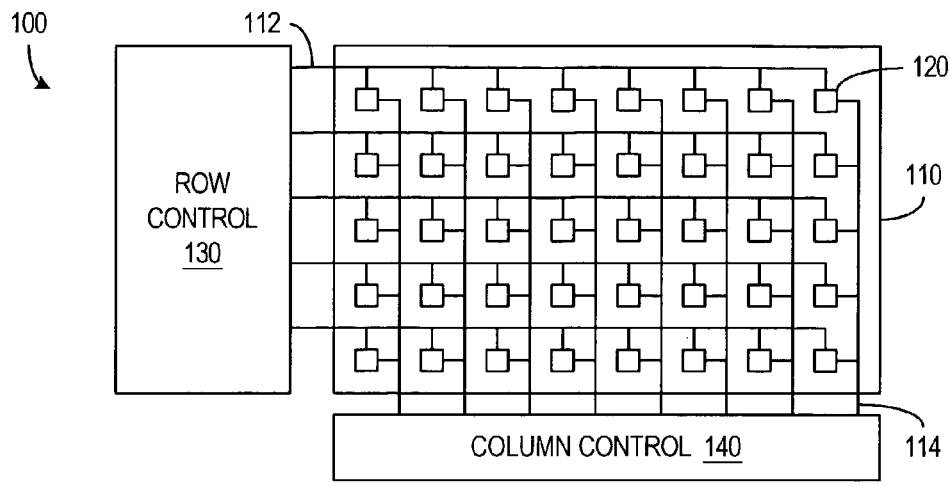
FIG. 1 is a circuit diagram of a conventional CMOS image sensor including an array of pixel sensors.
Figure 2:
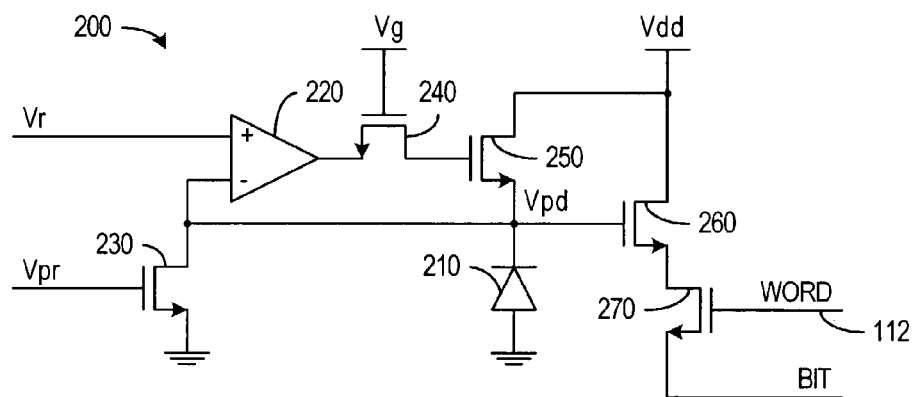
FIG. 2 is a circuit diagram of a known pixel sensor.
Figure 3:
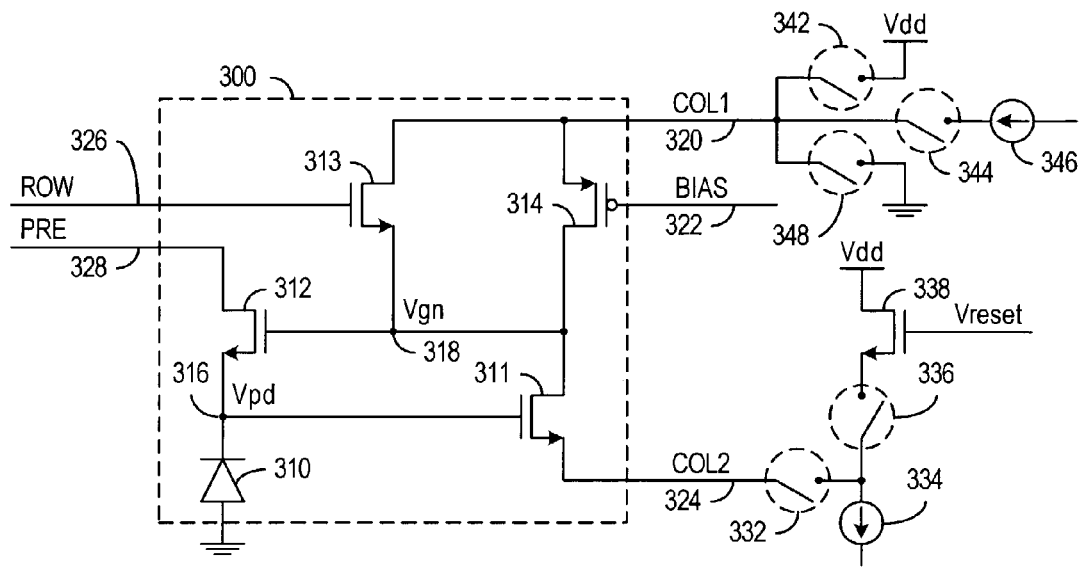
FIG. 3 is a circuit diagram of a 4-transistor pixel sensor and associated reset control circuitry in accordance with an embodiment of the invention.

FIG. 3 is a circuit diagram showing a 4-transistor pixel sensor 300 in accordance with an embodiment of the invention. Pixel sensor 300 would normally be part of an image sensor containing an array of substantially identical pixel sensor such as illustrated in FIG. 1. When in a sensor array, control lines and voltage supply lines connect pixel sensor 300 to control circuitry, and FIG. 3 illustrates some of the control circuitry 332, 334, 336, 338, 342, 344, 346, and 348 that operates pixel sensor 300 as described further below.

As illustrated, pixel sensor 300 includes a photodiode 310, NMOS transistors 311, 312, and 313, and a PMOS transistor 314. Photodiode 310 has a node 316 at a voltage Vpd. NMOS transistor 311 has a gate connected to photodiode node 316, a source/drain connected to a column line 324, and a drain/source region connected to a gain node 318. NMOS transistor 312 has a gate connected to gain node 318, a source/drain connected to photodiode node 316, and a drain/source connected to a control line 328. Transistors 313 and 314 are connected in parallel between gain node 318 and a column line 320. A row line 326 connects to the gate of transistor 313, and a control line 322 connects to the gate of transistor 314.

NMOS transistors 311, 312, and 313 and PMOS transistor 314 are preferably of minimum sizes to make pixel sensor 300 as small as possible and to make the circuit area required for the transistors small relative to the photodiode area. However, with smaller pixel sensors, a reset circuit having a large gain and bandwidth, which are important for suppressing the noise, may be harder to achieve. Additionally, smaller transistors exhibit more thermal and flicker noise, which is undesirable. The size of the transistors may thus be chosen to achieve the best balancing of these factors.

Figure 4:
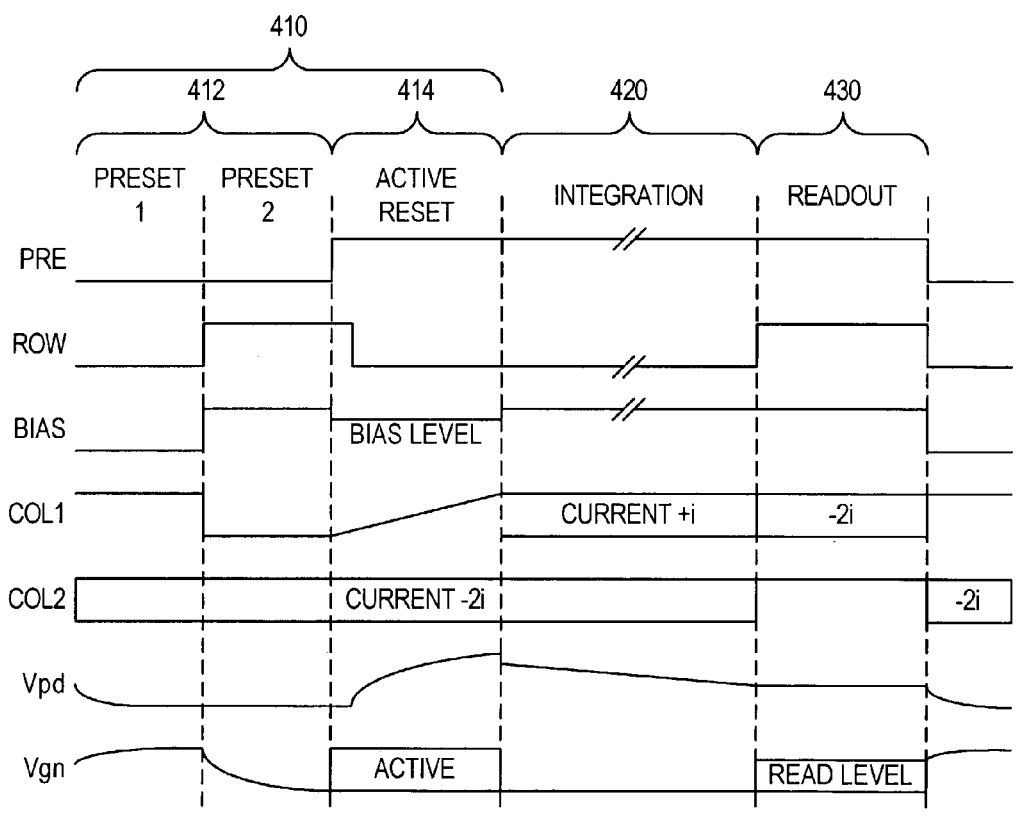
FIG. 4 is a timing diagram for some of the signals used during operation of the pixel sensor of FIG. 3.

FIG. 4 is a timing diagram illustrating the operation of pixel sensor 300 during a reset operation 410, an integration operation 420, and a readout operation 430. The reset operation includes a preset phase 412 and an active reset phase 414.

Preset phase 412 of reset operation 410 includes two timing steps. During the first timing step, control signal COL1 on column line 310 is pulled high (to supply voltage Vdd), and control signals PRE and BIAS respectively on control lines 322 and 328 are pulled low (to ground.) Signal BIAS turns on PMOS transistor 314, which pulls gain node 318 toward supply voltage Vdd. The high voltage on gain node 318 turns on transistor 312, which pulls photodiode node 316 to ground, which is then the voltage level of signal PRE. The states of signals ROW and COL2 are not critical during this time step of preset phase 412. However, since transistor 311 may initially be conductive, signal COL2 on column line 324 should not be such that transistor 311 overcomes transistor 314 and pulls down gain node 318. In an exemplary embodiment of the invention, a switch 332 in the control circuitry connects transistor 311 to a current source 334 that pulls a fixed current 2I.

For the second time step of preset phase 412, signals BIAS and ROW go high, while signal COL1 goes low. Signal ROW turns transistor 313 on so that transistor 313 discharges gain node 318, which turns off transistor 312. Accordingly, at the end of preset phase 412, both nodes 316 and 318 are discharged, and transistors 311 and 312 are off. The state of signal COL2 during the second time step of preset phase 412 is not critical, but in the exemplary embodiment switch 332 connects column line 324 to current source 334.

During active reset phase 414, signal PRE goes high, while signal BIAS assumes a non-critical cascode bias level. Signal ROW goes low to turn off transistor 313. In the control circuitry, a switch 344 connects a current source 346 to drive signal COL1 at a current strength I, and switches 332 and 336 connect current source 334, which has a current strength 2I (twice that of current source 346). A switch 336 connects a pull-up transistor 338 to column line 324 so that current source 334 pulls current through both transistor 338 and transistor 311. A reference voltage Vreset applied to the gate of pull-up transistor 338 is increased.

Initially during active reset phase 414, signals COL1, Vgn, and Vpd are all near ground level. Transistors 313 and 314 are initially off, allowing current source 346 to charge up signal COL1. When signal COL1 is high enough (i.e., above the voltage level of signal BIAS), transistor 314 turns on and begins charging gain node 318. When voltage Vgn on gain node 318 approaches the threshold voltage level of transistor 312, transistor 312 begins charging photodiode node 316, and when voltage Vpd on photodiode node 316 approaches the voltage level of signal Vreset, transistor 311 begins to turn on. As a net effect, voltages Vgn and Vpd rise until transistor 311 conducts current I. At this point transistor 338 also conducts a current I, and voltage Vpd is equal to reference voltage Vreset if transistors 311 and 338 have the same size.

Reset operation 410 ends when signal BIAS goes high shutting off transistor 314. Current source 334 immediately pulls voltage Vgn to ground level, shutting off transistor 312 and trapping photodiode signal Vpd at reference voltage level Vreset.

For the integration operation, signal ROW is low and signal BIAS is high to shut off transistors 313 and 314, isolating the pixel from signal COL1. While the row containing sensor 300 is integrating, other rows in a sensor array may be resetting or reading, which may cause signal COL2 to fluctuate. Such fluctuations, which can charge and discharge Vgn through transistor 311, do not interfere with the integration operation in pixel sensor 300 because transistor 311 limits the charging of node 318 so that voltage Vgn can never charge to a voltage higher than photodiode voltage Vpd minus the threshold voltage of NMOS transistor 311. Accordingly, transistor 312 remains off while photodiode 310 drains charge from photodiode node 316 at a rate depending on the incident light intensity.

Readout operation 430 begins when integration operation 420 is complete. Signals COL2 and ROW are pulled high, which reverses the current flow through transistor 311. The terminal of transistor 311 connected to gain node 318 thus becomes the source of transistor 311 during readout operation 430. Signal COL1 can then be used to measure photodiode voltage Vpd since current through transistor 311, gain voltage Vgn, and the level of signal COL1 all depend on the gate voltage Vpd of transistor 311.

Figure 5:
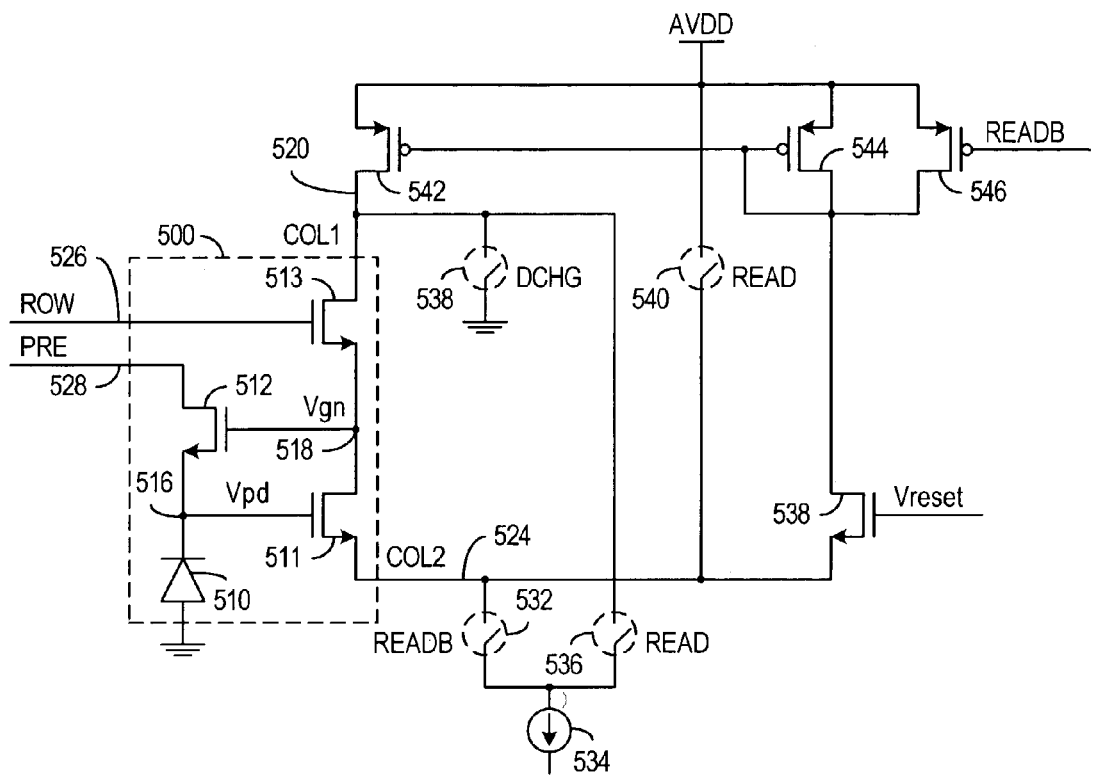
FIG. 5 is a circuit diagram of a 3-transistor pixel sensor and associated reset control circuitry in accordance with an embodiment of the invention.

FIG. 5 is a circuit diagram showing a 3-transistor pixel sensor 500 in accordance with another embodiment of the invention. Pixel sensor 500, like pixel sensor 300 of FIG. 3, would normally be part of an image sensor such as illustrated in FIG. 1, which contains an array of substantially identical pixel sensors.

Pixel sensor 500 includes a photodiode 510 and three NMOS transistors 511, 512, and 513. NMOS transistor 511 has a gate coupled to a node 516 of photodiode 510, a source/drain coupled to a column line 524, and a drain/source coupled to a gain node 518. NMOS transistor 512 has a gate coupled to gain node 518, a source/drain photodiode node 516, and a drain/source connected to a control line 528. NMOS transistor 513 has a gate coupled to a control line 526, a source/drain coupled to gain node 518, and a drain/source coupled to a control line 520.

FIG. 5 also shows some of the control circuitry for operation of pixel sensor 500. In particular, column line 520, which carries a signal COL1, is connected to a PMOS transistor 520, a switch 538, and a switch 536. Switches 536 and 538 may be part of a selection circuit used to select particular rows of a sensor array for access. PMOS transistor 520 is connected to mirror the current through a PMOS transistor 544 that is connected in parallel with a by-pass or shunt transistor 546. Column line 524 is connected to through a switch 532 to a current source 534 and to a NMOS transistor 538 that is in series with transistors 544 and 546. When pixel sensor 500 is part of a sensor array such as sensor array 110 of FIG. 1, elements 532, 534, 536, 538, 540, 542, 544, and 546 would be located with other control circuitry in column control block 140.

Figure 6:
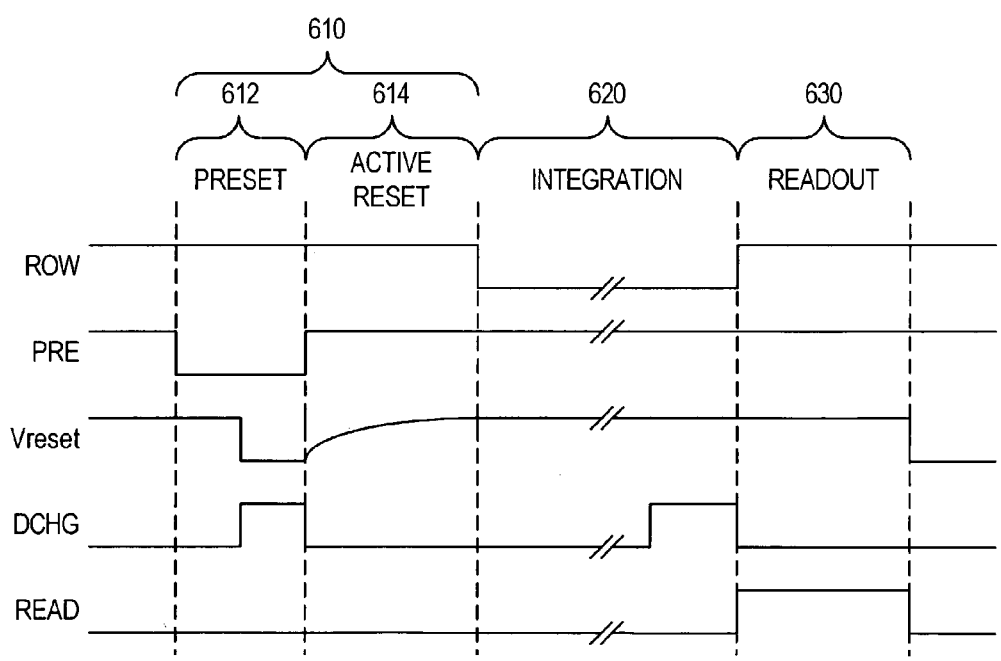
FIG. 6 is a timing diagram for some of the signals used during operation of the pixel sensor of FIG. 5.

FIG. 6 is a timing diagram for some of the signals used when pixel sensor 500 determines a pixel value for an image. The operation of FIG. 6 includes a reset operation 610, an integration operation 620, and a readout operation 630. Reset operation 610 is divided into a preset phase 612 and an active reset phase 614.

During preset phase, a reference signal Vreset applied to the gate of NMOS transistor 538 is initially set to its maximum level, which is the desired reset level of photodiode voltage Vpd. Control signal ROW on control line 526 and control signal READB are high, and control signals PRE on control line 528 and control signal READ are low. Signal READB turns on switch 532 and turns off transistor 546, while signal READ turns off switches 536 and 540. Control signal DCHG is initially low so that switch 538 is off.

The initial states of the control signals cause current source 534 to create a current flow through transistors 544 and 538, and that current is mirrored through PMOS transistor 542 onto column line 520. NMOS transistor 513 conducts the current from column line 520 to gain node 518, resulting in an increase in a voltage Vgn. When voltage Vgn rises high enough to turn on transistor 512, transistor 512 discharges photodiode node 516 to the low level of control signal PRE, keeping transistor 511 non-conductive.

Control signal Vreset is brought low, and control signal DCHG is pulsed high at the end of preset phase 612. Control signal Vreset thus shuts off the currents through PMOS transistors 541 and 544, while control signal DCHG turns on switch 538 to ground control line 520. Since signal ROW is still high, transistor 513 is still conductive and pulls voltage Vgn on gain node 618 low (ground). Transistor 512 is thus shut off with photodiode voltage Vpd low. Control signal DCHG returns to low at the end of preset phase 612, shutting off switch 538 and effectively floating control line 520 and gain node 518.

At the beginning of active reset phase 614, control signal PRE goes high, and control signal Vreset begins ramping up from the ground level. Current flow through transistor 544 and the mirrored current through transistor 542 to column line 520 correspondingly ramp up with the increase in signal Vreset. In pixel sensor 500, current from column line 520 flows through transistor 513 and raises the voltage Vgn on gain node 518, which is coupled to the gate of transistor 512. Transistor 512 thus begins charging photodiode node 516 from the high level of control signal PRE, turning on transistor 511. Transistors 511, 538, 542, and 544 cause voltage level Vpd to stabilize at the same level as control signal Vreset. This results from a unity feedback path from node 518 to node 516 through transistor 512, which is configured as a source follower with a capacitive load.

Because of the unity-gain feedback, the reset noise that is within the bandwidth of the amplifier is reduced by a factor about equal to the amplifier gain relative to the noise on photodiode node 518 in the absence of a feedback loop. This noise is related to the capacitance C of photodiode node 518 as the square root of (kT/C), where k is Boltzmann's constant and T is temperature in degrees Kelvin. Accordingly, at the end of active reset phase 614, voltage Vpd on photodiode node 516 is accurately set to the maximum level of control signal Vreset.

Integration operation 620 begins when control signal ROW drops to low and shuts off transistor 513. Current source 534 via transistor 511 then pulls voltage Vgn on gain node 518 low, which shuts off transistor 512 while signal Vpd on photodiode node 516 is at the maximum level of voltage Vreset. Voltage Vgn on gain node 518 can be charged and discharged via transistor 511 during integration operation 620, but transistor 511 limits voltage Vgn so that voltage Vgn can never go higher than the level of photodiode voltage Vpd minus the NMOS threshold voltage. This ensures that transistor 512 remains off throughout integration operation 620.

At the end of integration operation 620, control signal DCHG is pulsed high to turn on switch 538 and discharge control line 520 (i.e., signal COL1) to prepare for readout operation 630. This prevents voltage Vgn from rising to a high level. If voltage Vgn were to recharge to a high level before readout operation 630 is complete, photodiode node 618 will inadvertently reset through transistor 512.

After integration operation 620 is done and the pulse in signal DCHG has sufficiently discharged signal COL1, control signals READ and ROW are driven high, and control signal READB is driven low. The change in control signals READ and READB while control signal ROW is high reconnects current source 534 to reverse the direction of current through pixel sensor 500. Signal READ also turns on switch 540, which pulls signal COL2 up to near supply voltage Vdd. As a result, transistor 511 acts as a source-follower device with a drain connected to column line 524 and a source connected to gain node 518. Since photodiode voltage Vpd remains on the gate of transistor 511, photodiode voltage Vpd can be read via signal COL1 on column line 520. Transistor 511 thus acts as a buffer for readout of photodiode voltage Vpd. Again, transistor 512 remains off because voltage Vgn is always lower than voltage Vpd by at least an NMOS threshold voltage.

Transistor 546, which is a shunt across transistor 544 and is controlled by signal READB, prevents current flow through transistor 544, which would be mirrored to transistor 542, from interfering with accurate readout via signal COL1.

Figure 7:
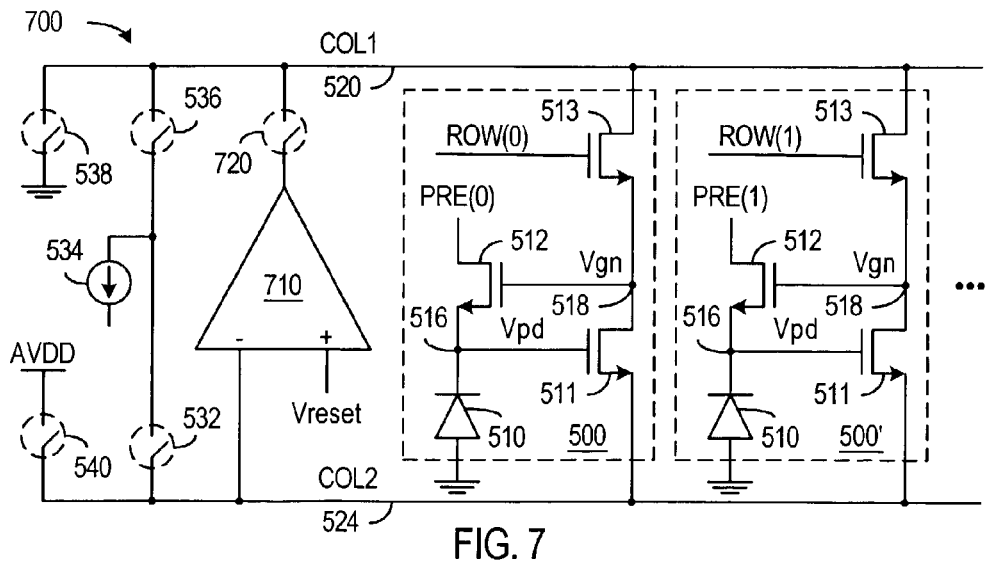
FIG. 7 is a circuit diagram of a CMOS image sensor in accordance with another embodiment of the invention.

FIG. 7 shows a portion of a CMOS image sensor 700 in accordance with another embodiment of invention. CMOS image sensor 700 includes pixel sensors 500 and 500' and control circuitry including switches 532, 536, 538, and 540, current source 534, an operational amplifier 710, and a switch 720. Pixel sensors 500 and 500' in CMOS image sensor 700 are structurally identical to pixel sensor 500 of FIG. 5, which is described above. Switches and circuit elements 532, 534, 536, 538, and 540 are also described above with reference to FIG. 5 and operate in the already-described manner during the reset operation, the integration operation, and the readout operation. In particular, switch 532 is on during the reset operation when current flows in a first direction through pixel sensor 500 or 500', but switch 536 is turned on to reverse the current flow through pixel sensor 500 or 500' for pixel readout on via signal COL1 on column line 520.

Unlike the embodiment of the invention illustrated in FIG. 5, CMOS image sensor 700 of FIG. 7 does not use source follower transistor 511 as one of the transistors in a differential pair gain circuit during the active reset phase. Instead, amplifier 710 supplies the gain when switch 720 connects amplifier 710 to drive column line 520. CMOS image sensor 700 thus has the advantage of being able to supply a large gain with the external op-amp as opposed to being limited in gain by the small size of transistor 511 in pixel sensor 500.

FIG. 7 also illustrates how control circuitry including amplifier 710 is replicated once every column in an array of pixel sensors, so that pixel sensors 500, 500', . . . that are in the same column of the array share one amplifier 700. A pixel sensor 500 or 500' in a particular row of the sensor array can be selected using control signals ROW(0) and PRE(0) or ROW(1) and PRE(1) corresponding to the selected row.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A pixel sensor comprising:
   a photodiode coupled to a first node;
   a first transistor having a gate coupled to the first node, a first terminal coupled to a first control line, and a second terminal coupled to a second node;
   a second transistor having a gate directly coupled to the second node, a first terminal coupled to the first node, and a second terminal coupled to a second control line; and a third transistor having a gate coupled to a third control line, a first terminal directly coupled to the second node, and a second terminal coupled to a fourth control line, wherein each of the first control line, the second control line, the third control line, and the fourth control line is connected for application of signals at different levels for different operations that the pixel sensor performs.

2. The sensor of claim 1, wherein the first, second, and third transistors are the only transistors in the pixel sensor.

3. The sensor of claim 1, wherein each of the first, second, and third transistors is an NMOS transistor.

4. A pixel sensor comprising
a photodiode coupled to a first node;
a first transistor having a gate coupled to the first node, a first terminal coupled to a first control line, and a second terminal coupled to a second node;
a second transistor having a gate directly coupled to the second node, a first terminal coupled to the first node, and a second terminal coupled to a second control line;
a third transistor having a gate coupled to a third control line, a first terminal directly coupled to the second node, and a second terminal coupled to a fourth control line; and
a fourth transistor having a gate coupled to a fifth control line, a first terminal coupled to the second node, and a second terminal coupled to the fourth control line.

5. The sensor of claim 4, wherein the first, second, third, and fourth transistors are the only transistors in the pixel sensor.

6. The sensor of claim 4, wherein each of the first, second, and third transistors is an NMOS transistor, and the fourth transistor is a PMOS transistor.

7. An image sensor comprising:
a first set of control lines:
a second set of control lines:
a third set of control lines:
a fourth set of control lines:
a fifth set of control lines; and
an array of pixel sensors, wherein each pixel sensor in the array is coupled to a corresponding first control line from the first set, a corresponding second control line from the second set, a corresponding third control line from the third set, and a corresponding fourth control line from the fourth set, and wherein
each pixel sensor comprises:
a photodiode coupled to a first node;
a first transistor having a gate coupled to the first node, a first terminal coupled to the first control line, and a second terminal coupled to a second node;
a second transistor having a gate coupled to the second node, a first terminal coupled to the first node, and a second terminal coupled to the second control line;
a third transistor having a gate coupled to the third control line, a first terminal coupled to the second node, and a second terminal coupled to the fourth control line; and
a fourth transistor having a gate coupled to a corresponding fifth control line from the fifth set of control lines, a second terminal coupled to the second node, and a first terminal coupled to the corresponding fourth control line.

8. The sensor of claim 7, wherein for each pixel sensor, the first, second, third, and fourth transistors are the only transistors in the pixel sensor.

9. The sensor of claim 7, wherein in each pixel sensor, each of first, second, and third transistors is an NMOS transistor, and the fourth transistor is a PMOS transistor.

10. An image sensor comprising:
an array of pixel sensors, wherein the pixel sensors in the array are arranged in rows and columns;
a first set of control lines, wherein each control line in the first set couples only to the pixel sensors that are in a corresponding column of the array;
a second set of control lines:
a third set of control lines, wherein each control line in the third set couples only to the pixel sensors that are in a corresponding row of the array; and
a fourth set of control lines, wherein each control line in the fourth set couples only to the pixel sensors that are in a corresponding column of the array,
wherein each pixel sensor in the array is coupled to a corresponding first control line from the first set, a corresponding second control line from the second set, a corresponding third control line from the third set, and a corresponding fourth control line from the fourth set, and wherein
each pixel sensor comprises:
a photodiode coupled to a first node;
a first transistor having a gate coupled to the first node, a first terminal coupled to the first control line, and a second terminal coupled to a second node;
a second transistor having a gate coupled to the second node, a first terminal coupled to the first node, and a second terminal coupled to the second control line; and
a third transistor having a gate coupled to the third control line, a first terminal coupled to the second node, and a second terminal coupled to the fourth control line.

11. The sensor of claim 10, wherein for each pixel sensor, the first, second, and third transistors are the only transistors in the pixel sensor.

12. The sensor of claim 10, wherein for each pixel sensor, each of the first, second, and third transistors is an NMOS transistor.

13. The sensor of claim 10, further comprising a control circuit outside the array of pixel sensors, wherein for each column of the array, the control circuit comprises:
a current source; and
a switching circuit to a corresponding one of the control lines from the first set and a corresponding one of the control lines in the fourth set, wherein the switching circuit connects the current source to create a current in one direction through a selected one of the pixel sensors during a reset operation, and the switching circuit connects the current source to create a current in an opposite direction through the selected one of the pixel sensors during a readout operation.

14. The sensor of claim 10, further comprising a set of amplifiers that are external to the array, wherein during a reset operation, each of the amplifiers has a first input terminal coupled to a corresponding one of the control lines in the first set, a second input terminal coupled to receive a reference voltage, and an output terminal coupled to drive a corresponding one of the control lines in the fourth set.

15. A method for operating a pixel sensor, comprising:
driving a first current in a first direction through a first transistor and a second transistor in the pixel sensor to control resetting a voltage of a node of a photodiode in the pixel sensor, wherein the first transistor has a gate coupled to the node and the second transistor has a gate to which a selection signal for the pixel sensor is applied;
performing an integration operation that changes the voltage on the node according to an intensity of incident light on the photodiode;

driving a second current in a second direction through the first and second transistors, the second direction being opposite to the first direction; and determining the voltage on the node from the effect of the first transistor on the second current.

16. The method of claim 15, wherein the first and second transistors are connected in series.

17. The method of claim 15, wherein driving the first current comprises:

driving a third current that is split between flowing through the first transistor in the pixel sensor and a reference transistor in a control circuit; and applying a voltage to a first terminal of a third transistor in the pixel sensor, the third transistor having a second terminal coupled to the node and a gate coupled to a terminal of the first transistor, wherein the second transistor pulls a voltage on the node to a level corresponding to a gate voltage of the reference transistor.

18. The method of claim 17, wherein a portion of the third current flowing through the first transistor changes until the voltage on the node reaches the level corresponding to the gate voltage of the reference transistor.

19. The method of claim 15, wherein driving the first current comprises connecting an amplifier that is external to the pixel sensor so that an output terminal of the amplifier is coupled to the second transistors, a first input terminal of the amplifier is coupled to a terminal of the first transistor, and a second input terminal of the amplifier is coupled to receive a reference voltage.

* * * * *